(12) United States Patent
Fujikawa et al.

(10) Patent No.: US 6,328,560 B1
(45) Date of Patent: Dec. 11, 2001

(54) PRESSURE PROCESSING APPARATUS FOR SEMICONDUCTORS

(75) Inventors: Takao Fujikawa; Takahiko Ishii; Tsuneharu Masuda; Makoto Kadoguchi; Yutaka Narukawa, all of Takasago (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 09/496,058

(22) Filed: Feb. 2, 2000

(30) Foreign Application Priority Data

Feb. 3, 1999 (JP) .................................................. 11-026379

(51) Int. Cl.⁷ ..................................................... F27B 5/04
(52) U.S. Cl. ......................... 432/205; 432/152; 432/241; 118/725; 392/416
(58) Field of Search ........................... 432/5, 6, 11, 241, 432/205, 152, 253, 258; 219/390, 405, 411; 392/416, 418; 118/724, 725

(56) References Cited

U.S. PATENT DOCUMENTS

| 4,471,949 | * | 9/1984 | Ishii ...................................... 266/252 |
| 5,527,561 |   | 6/1996 | Dobson . |
| 5,554,226 | * | 9/1996 | Okase et al. ........................... 118/724 |
| 5,927,077 | * | 7/1999 | Hisai et al. ............................. 62/3.3 |

FOREIGN PATENT DOCUMENTS

| 4-136820 | 5/1992 | (JP) . |
| 7-65857  | 7/1995 | (JP) . |

* cited by examiner

*Primary Examiner*—Jiping Lu
(74) *Attorney, Agent, or Firm*—Oblon, Spivak, McClelland, Maier & Neustadt, P.C.

(57) ABSTRACT

An inner vessel 16 capable of hermetically surrounding a portion for disposing works W is disposed to the inside of a pressure vessel 4, the inner vessel 16 is provided with a gas introducing portion 18 at a lower position thereof free from the effect a high temperature atmosphere formed by heaters 11 and 12, a filter 20 is disposed to the gas introducing portion 18 and a check valve 19 is disposed to the inner vessel 16 for allowing a gas to flow unidirectionally from the inside to the outside thereof.

10 Claims, 7 Drawing Sheets

100% # PRESSURE PROCESSING APPARATUS FOR SEMICONDUCTORS

FIELD OF THE INVENTION AND RELATED ART STATEMENT

The present invention concerns a high pressure gas processing apparatus for semiconductors.

As a method of processing ULSI semiconductors such as silicon wafers, a so-called pressure-filling method of wiring films (high pressure reflow process) has been known in which an oxide insulator film having contact holes is formed on a semiconductor substrate, an aluminum alloy film is formed on the oxide film and then high temperature/high pressure circumstance is formed with an inert gas such as argon gas to fill the aluminum alloy film to the deepest portion in the contact holes (refer to Japanese Patent Laid-Open Hei 7-193063; being hereby fully incorporated by reference).

In addition, it has also been known a high pressure oxidation method of forming an oxide insulation film in a low temperature region by using a gas mixture comprising oxygen, moisture, argon and the like, further, a high pressure oxynitridation method of mixing also nitrous oxide gas to form a gate oxide film.

A pressure-processing apparatus used for such processing includes, for example, such an apparatus in which a processing chamber capable of placing works such as wafers is formed to the inside of a vertical cylindrical pressure vessel having an upper lid and a lower lid, and the periphery of a portion for pressing the work is surrounded with a heating unit, for example, of an ohmic wire heating system (so-called electric heater).

Further, the pressure vessel of this type is adapted, for example, to load and unload works from below by opening/closing a lower lid, in which a pressure control unit capable of charging/discharging a processing gas or conducting evacuation relative to the processing chamber is often provided to an upper lid disposed fixedly (for example, refer to Japanese Patent Publication Hei 7-65857; being hereby fully incorporated by reference).

By the way, in the pressure-processing for semiconductors as described above, it is a most important subject that various powdery dusts (particles) are not deposited on the works.

In view of the above, worry of involving powdery dusts contained in atmospheric air or powdery dusts deposited on works themselves or on a supporting device for supporting the works upon loading/unloading the works relative to the pressure vessel can be coped with to some extent, for example, by keeping the circumstance clean where the pressure vessel is installed (such as location of the pressure vessel in a clean room).

Further, it is a customary means for powdery dusts occurring by abrasion of sealing materials used for valve portions or pipeline connection portions equipped in a supply source for a processing gas or various kinds of equipments to eliminate them by disposing filters in place in pipelines. The filter is considered useful for removing powdery dusts mixed in a processing gas in a case of recovering the processing gas from a pressure vessel on every termination of one cycle of processing and then reutilizing the same.

Furthermore, referring limitatively to a case of newly manufacturing a pressure vessel, it has been attempted to suppress occurrence of powdery dusts caused by the processing chamber itself by using rust proof metal such as stainless steels for the material of forming the pressure vessel.

However, in a case where powdery dusts occur due to rust or the like formed on the inner surface of the pressure vessel such in a case where the pressure vessel is an existent one, and it is not formed with the rust proof metal, or in a case where powdery dusts occur from a heat insulating structure or a heating unit disposed to the inside of the pressure vessel, it is actually very much difficult to inhibit deposition of powdery dusts (in particulate form) to works, except for gaseous impurities that can be adsorbed and removed by a gettering material.

Further, since the existent pressure-processing apparatus (refer to Japanese Patent Publication Hei 7-65857; being hereby fully incorporated by reference) is a sheet-to-sheet type cluster tool type device adapted to load and unload works to and from a pressure vessel on every processing of a sheet of the work, there is a problem of poor processing efficiency for semiconductors.

Particularly, in a case where works are semiconductor silicon wafers, it is considered important that an inert gas, (particularly, impurity components contained therein) and a work do not take place reaction, powdery dusts (particles) occurring from heaters or a heat insulating structure zone do not deposit on the works and regional deviation or fluctuation with lapse of time is not caused in the temperature and the pressure in the processing chamber during entire processing and on every processing, but they are not always satisfactory in the existent pressure-processing apparatus.

OBJECT AND SUMMARY OF THE INVENTION

The present invention has been accomplished in view of the foregoing situations and it is an object thereof to provide a pressure-processing for semiconductors capable of thoroughly inhibiting deposition of powdery dusts on works in a pressure-processing of semiconductors and capable of obtaining semiconductors at high and constant quality.

In accordance with the present invention, the following technical means are adopted for attaining the foregoing object.

That is, a pressure-processing for semiconductors according to the present invention comprises, a processing chamber formed in a pressure vessel and having a portion which can place works and charge and discharge a processing gas, heating units disposed so as to surround the portion of placing the works in the processing chamber around a vertical axis, an inner vessel made of a hermetically sealing material disposed between the inside of the heating units and the portion for placing the works to isolate them from each other, a gas introducing portion disposed in the lower portion of the inner vessel and a filter for collecting powdery dusts disposed to the gas introducing portion.

Since the constitution described above is adopted, when a processing gas is supplied into a pressure vessel for pressure-processing of works (semiconductors) in a processing chamber, since the processing gas can reach the works only by passing a gas introducing portion of an inner vessel, and a filter is disposed to the gas introducing portion, powdery dusts contained in the processing gas (including powdery rusts or the like formed in the pressure vessel) are always captured by the filter and are prevented from depositing on the works.

Accordingly, semiconductors at high and constant quality can be obtained after the processing.

Further, the pressure vessel is generally adapted such that a heat insulating structure formed in the shape of an inverted cup is disposed to the inside and the heating unit is disposed along the inner circumferential surface of the heat insulating structure. Further, the pressure vessel is often adapted to allow loading and unloading of works by opening a lower portion (lower lid) thereof and it is often adapted in this structure such that the processing gas is supplied to the pressure vessel from an upper portion (upper lid) thereof.

In this case, the processing gas basically flows from the upper portion along the inner circumferential surface downwardly in the pressure vessel and then flows upwardly from the lower portion (lower opening portion of the heat insulating structure) in a space for locating the heating unit. Further, when the heating unit is in a heating state, heat from the heating unit conducts always upwardly to make the space for locating the heating unit and a portion thereabove as a high temperature region (at about several hundreds to 1000° C.), whereas a relatively low temperature range (about 200° C. or lower) is maintained below the space for locating the heating unit.

In view of the above, it is suitable that the gas introducing portion disposed to the inner vessel is positioned on the side of the lower portion in the inner vessel with a view point of making the flow of the processing gas to the portion for disposing works smooth and protecting the filter from heat. Further, in order to simplify replacement and cleaning of the filter, it is suitable to position the gas introducing port to the lower side of the inner vessel.

When the processing gas introduced into the inner vessel is exhausted to the outside of the inner vessel for recovery or the like, if the processing gas flows again into the gas introducing portion, powdery dusts formed from the works and the like are deposited on the inner surface of the filter. Therefore, when the processing gas introduced again in the next cycle by way of the gas introducing portion into the inner vessel, powdery dusts on the inner surface of the filter are scattered in the inside of the inner vessel.

In order to avoid this disadvantage, in the present invention, a check valve for allowing the gas to flow unidirectionally from the inside to the outside of the inner vessel, which can avoid the disadvantage of scattering the powdery dusts on the inner surface of the filter into the inner vessel.

Further, a temperature sensor used for the temperature control of the heater is disposed on the inside of the inner vessel. This constitution can accurately detect temperature in the processing chamber and this can also provide merit that the inside of the processing chamber can be controlled easily to a predetermined temperature.

With the constitutions as described above, products of high and constant quality can be obtained as processed semiconductors.

It is recommended that the pressure vessel is preferably formed of rust proof metals such as stainless steels. In a case if it is obliged to use an existent pressure vessel (not made of rust proof metals) or rust proof metals can not be used by other reasons, it may suffice that the portion for disposing the works is positioned at the center and a casing made of a rust proof metal is disposed for surrounding the periphery of the heating unit. In this case, since it is necessary to interrupt communication of powdery dusts between the inside and the outside of the casing, a gas introducing portion provide with a filter is disposed to the casing.

Further, it is preferred that a check valve for allowing a gas to flow unidirectionally from the inside to the outside of the casing is disposed substantially by the same reason as in the case of the inner vessel.

Further, in the pressure-processing apparatus for semiconductors according to the present invention, a supporting device capable of vertically supporting a plurality of works is disposed in the processing chamber in the pressure vessel and heater are disposed in such an arrangement as surrounding the supporting device.

Accordingly, a plurality of works can be loaded at once, for example, by the unit of lots into the processing chamber of the pressure vessel to outstandingly improve the processing efficiency of semiconductors.

In any of the cases described above, it is preferred to vertically divide the heaters into a plurality of sections and also dispose a plurality of temperature sensors corresponding to the heaters respectively, which enables exact detection of the temperature distribution in the vertical direction of the processing chamber and controlling the heating uniformly in the entire processing chamber.

When an auxiliary heater is disposed to a base on which the supporting device is placed, since the lower portion of the processing chamber which is difficult to be heated can be heated efficiently, it is more suitable to the uniform heating in the processing chamber. In addition, it also provides merit capable of rapidly unifying the heating. Such a constitution is suitable, for example, to a case when the size of the pressure vessel is enlarged.

DETAILED DESCRIPTION OF THE PREFERRED EMBODIMENTS

Preferred embodiments according to the present invention are to be explained with reference to the drawings.

Figure 1:
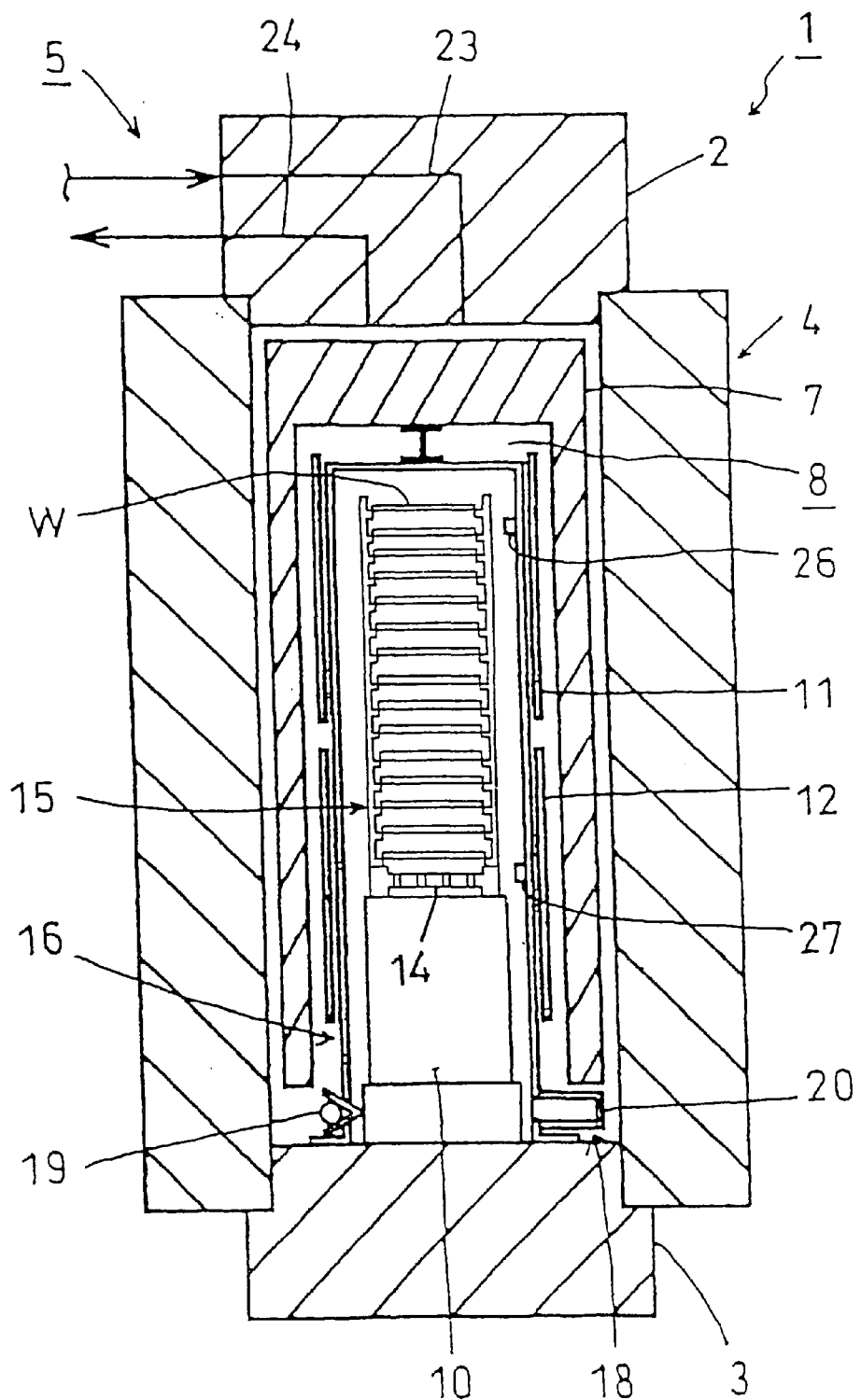
FIG. 1 is a cross sectional view showing a first embodiment of a pressure-processing apparatus according to the present invention.

FIG. 1 shows a first embodiment of a pressure-processing apparatus 1 according to the present invention.

The pressure-processing apparatus 1 comprises a cylindrical pressure vessel 4 having an upper lid 2 and a lower lid 3, a press frame (not illustrated) for holding the pressure vessel 4 axially (vertically), and a pressure control unit 5 for enabling charge/discharge of processing gas or evacuation relative to the pressure vessel 4.

A heat insulating structure 7 in the shape of an inverted cup is disposed in the pressure vessel 4, and a processing chamber 8 is formed inside of the heat insulating structure 7. A furnace floor member 10 is disposed in the lower portion of the processing chamber 8 such that it is placed on the lower lid 3. Further, heating units 11 and 12 vertically divided into two stages are disposed along the processing chamber 1 along with the inner lateral surface of the heat insulating structure 7.

Then, a supporting device 15 capable of supporting a plurality of works W vertically by way of a getter material 14 is disposed on the furnace floor member 10 and, accordingly, each of the heating units 11 and 12 is adapted to surround the supporting device 15, namely, the portion for disposing the works W around the vertical axis.

Further, an inner vessel 16 in the shape of an inverted cup is disposed between both of the supporting device 15 and the heating units 11 and 12. The inner vessel 16 surrounds the supporting device 15 and a lower end thereof reaches as far as the lower limit to be joined hermetically in this state.

A gas introducing portion 18 and a check valve 19 are disposed at one or plurality of circumferential portions in a lower part of the inner vessel 16. A cup-shaped filter 20 is disposed to the gas introducing portion 18. Further, the check valve 19 is disposed in the direction of allowing a gas to flow unidirectionally from the inside to the outside of the inner vessel 16.

The pressure vessel 4 is formed of a rust proof metal such as stainless steels. Then, the processing chamber 8 is made openable/closable by vertically moving the lower lid 3 and the supporting device 15 moves downwadly together with downward movement of the lower lid 3, thereby enabling loading/unloading of the works W.

Further, it is preferred to dispose a filter in place in the midway of pipelines (not illustrated) in the pressure control unit 5 such that it is possible to interrupt communication of powdery dusts formed due to sealing materials and the like used in valve portions or pipeline joint portions provided to a gas charge/discharge device or various equipments.

For the upper and lower heating units 11 and 12, an ohmic wire heating type is used. Each of the heating units is adapted to put to be temperature control dependently of each other based on each detection value from the temperature sensors 26 and 27 disposed so as to correspond to each of the positionings of the upper and lower heating units 11 and 12 at the inside of the inner vessel 16.

The divisional number for the heating units 11 and 12 is not particularly limited and it may be increased, for example, to three or four divisional number.

The number of works supported by the supporting device 15 is preferably a number equal with the number for the lot unit of the works W (for example, one lot comprises 13 or 25 sheets) or an integer multiple thereof. It is of course possible to adapt to support a single work W.

The getter material 14 is made of Ti, Zr or the like which is formed by itself or preferably applied with coating at the surface with the material. In this constitution, since the getter material 14 preferentially reacts with gas impurity components contained in the processing gas and absorbs to remove them, it is possible to suppress the possibility that the works W take press reaction with the gas impurity components.

The furnace floor member 10 and the inner vessel 16 are formed of a hermetically sealing material. Particularly, at least the surface of the inner vessel 16 is preferably finished to an extremely smooth state in order to make the gas impurity components to be less adsorbed.

For the filter 20 in the gas introducing portion 18 disposed to the inner vessel 16, a material of excellent pressure resistance and heat resistance is used. Specifically, there can be mentioned powder of stainless steels or nickel sintered into the configuration of a cup or the like.

It is necessary that the filter 20 has heat resistance but, since the gas introducing portion 18 is disposed at a location for the lower portion of the inner vessel and the position is at a height lower than the heating units 11 and 12, it may suffice that the filter 20 can withstand the heat at about 200° C.

Further, it is necessary that the filter 20 can collect powdery dusts as small as 0.2 $\mu$m. If such a fine filter as directly attaining the requirement all at once is used, it suffers from clogging at a relatively early stage and causes requirement of exchange frequent or cleaning. Then, for avoiding such disadvantage, it may adopt a countermeasure of combining several filters having from rather coarse mesh to fine mesh, with the filter at the final position having a mesh of 0.2 $\mu$m or finer.

When semiconductors are processed by using the pressure-processing apparatus 1 with the constitution described above, at first, the lower lid 3 is moved downwardly in the pressure vessel 4, and a plurality (for example, two lots) of works W are supported on the supporting device 15 taken out of the pressure vessel 4 by the movement. In this case, the inner vessel 16 remains inside the pressure vessel 4.

Subsequently the lower lid 3 is moved upwardly and the apparatus is assemble in a predetermined manner, for example, by holding the pressure vessel 4 on a press frame (not illustrated) into the state shown in FIG. 1. With this procedure, the lower end of the inner vessel 16 and the lower lid 3 are joined effectively in a hermetically sealed manner.

Then, a so-called gas replacing operation is repeated for once or several times, which comprising evacuating the inside of the processing chamber 8 of the pressure vessel 4 by actuating a vacuum pump, and then actuating the gas charge/discharge device and charging a processing gas at about 5 to 10 kgf/cm$^2$ into the processing chamber 8. Then, the processing gas is charged again and the pressure in the inside of the processing chamber 8 is increased to a predetermined pressure of about several hundreds kgf/cm$^2$.

At the same time, heating is started by heating units 11 and 12 to reach a predetermined temperature of several hundreds ° C. to 1000° C. in the processing chamber 8. They are temperature elevation/pressure increasing steps.

If the powdery dusts are incorporated for the first time in the processing gas or powdery dusts should occur from the heat insulating structure 7, heating units 11 and 12 or the inner surface of the pressure vessel 4, the powdery dusts are collected by the filter 20 disposed to the gas introducing portion 18 and do not intrude into the inner vessel 16. Therefore, the works W supported by the support device 15 are exposed only to the clean processing gas and the powdery dusts are not deposited.

After completing the temperature elevation/pressure increasing steps, a so-called holding step of leaving the works for a predetermined period of time while keeping a uniform temperature distribution in a vertical direction relative to the supporting device 15, namely, to all the works W is conducted.

After the completion of the holding step, it enters temperature lowering/pressure decreasing steps in which heating control is conducted by each of heating means 11 and 12 (control for supplied power), and the processing gas recovered and exhausted from the processing chamber 8 by the gas charge/discharge device of the pressure control unit 5, to lower the temperature and the inner pressure in the processing chamber 8 in a predetermined period of time.

In this case, the processing gas is exhausted from the inner vessel 16 through the check valve 19. That is, since the processing gas is prevented from flowing from the inside to the outside of the filter 20, if the processing gas filled in the inner vessel 16 contains powdery dusts formed from the works W, the supporting devices 15 and the like, they can be prevented from depositing on the inner surface of the filter 20. In addition, powdery dusts collected on the outer surface of the filter 20 are not scattered again in the processing chamber 8.

Then, when the pressure vessel 4 is opened and the processing semiconductors are taken out of the supporting device 15, one cycle for the processing of the semiconductors is complete.

Figure 2:
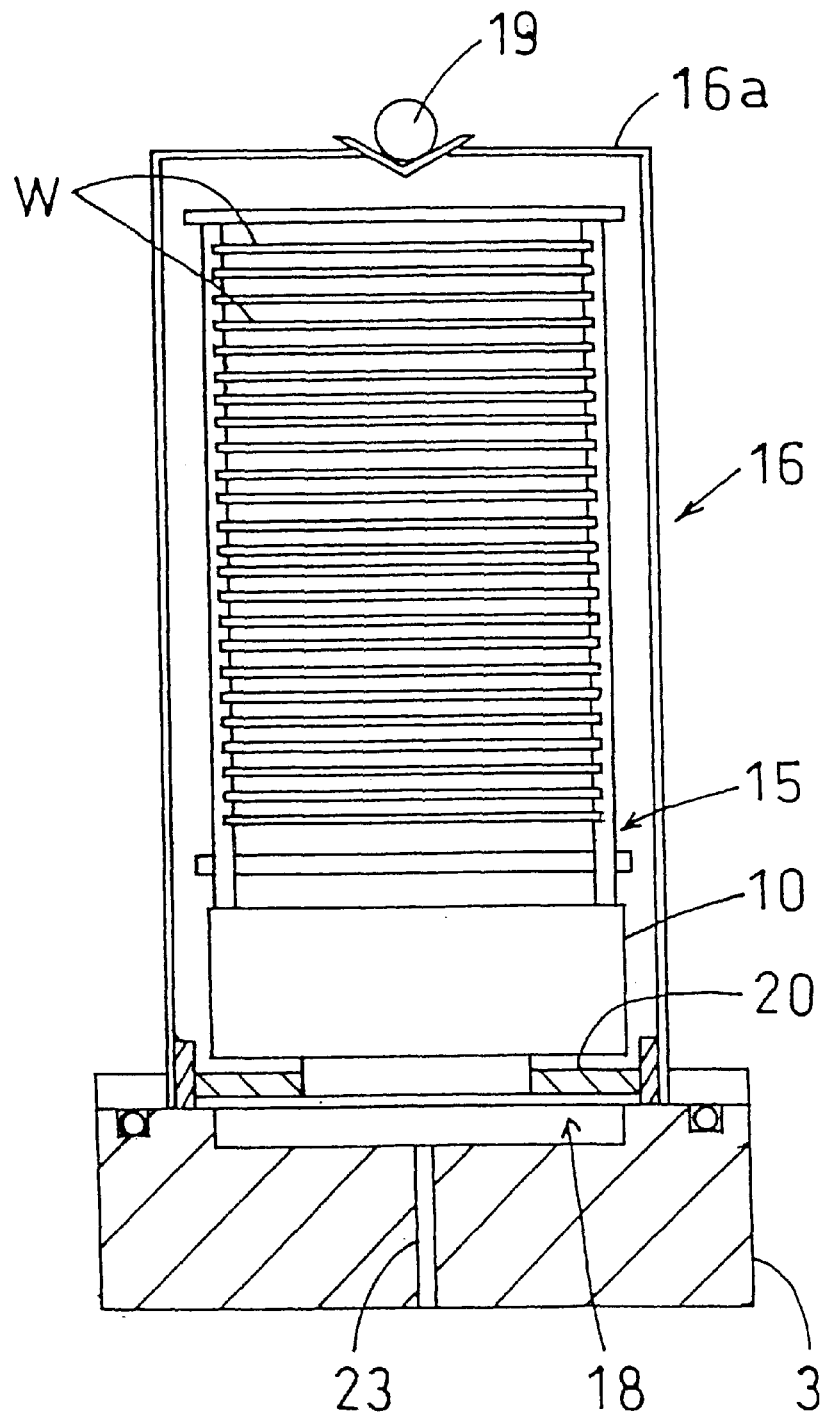
FIG. 2 is a cross sectional view showing a principal portion in a second embodiment of a pressure-processing apparatus according to the present invention.

FIG. 2 corresponds to a second embodiment of the pressure-processing apparatus 1 according to the present invention and shows an inner vessel 16 and a supporting device 15 disposed in a pressure vessel 4 (only a lower lid 3 is shown).

In this second embodiment, a gas channel 23 for a processing gas is disposed to the lower lid 3 of the pressure vessel 4 and the processing gas is adapted to be exhausted from an upper lid (not illustrated).

Therefore, in the inner vessel 16, a gas introducing portion 18 is constituted as a ring-like opening formed between a lower end opening of the vessel and the outer circumferential surface of a floor bed member 10, and a doughnuts-like filter 20 is disposed such that it fits entirely to the gas introducing portion 18. A check valve 19 is disposed to a ceiling surface 16a of the inner vessel 16.

In such a constitution, since the gas flowing area of the filter 20 is enlarged and the flow rate of the processing gas passing therethrough is lowered, occurrence of a pressure difference upon inflow of the gas can be suppressed. Therefore, it leads to an advantage that the material for forming the filter 20 can be selected from a wide range with a view point of the pressure resistance strength. Particularly, when the downward flowing rate of the processing gas can be lowered, organic materials such as resins can also be used as the material for forming the filter 20.

Further, also for the check valve 19, a simple structure of opening/closing by the self weight of a valve body (not illustrated) can be used to provide various advantages such as reliable operation property and compact structure. For the check valve 19, a structure mainly using metals or ceramics is suitable for providing heat resistance.

Figure 3:
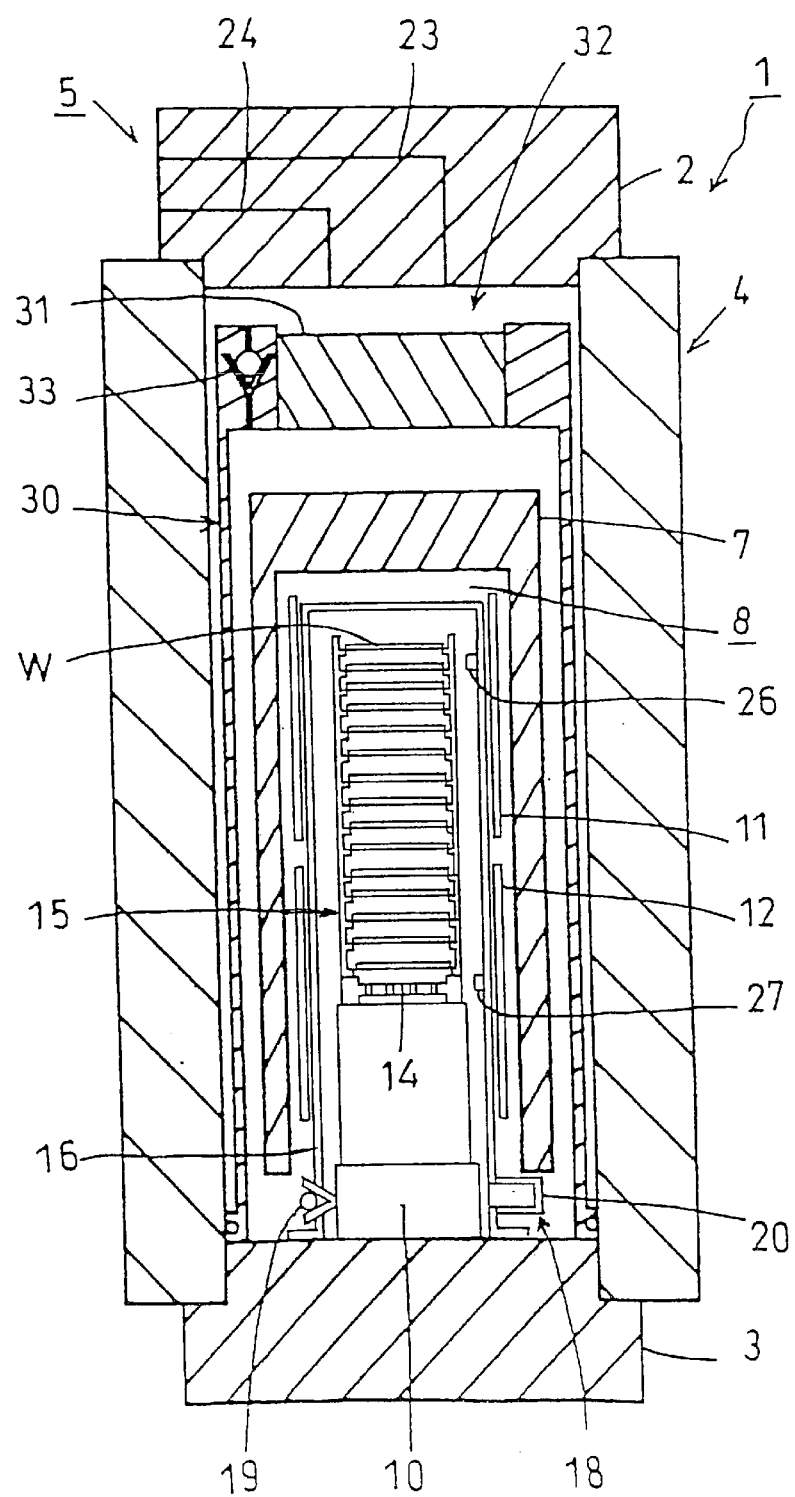
FIG. 3 is a cross sectional view showing a third embodiment of a pressure-processing apparatus according to the present invention.

FIG. 3 shows a third embodiment of a pressure-processing apparatus 1 according to the present invention.

In the case of the third embodiment, an existent member (that is formed, for example, with high strength steels or the like not formed with rust proof metals) is utilized for a pressure vessel 4 in which an inner vessel 16 provided with a gas introducing portion 18 or a check valve 19 are disposed in the pressure vessel and, in addition, a supporting device 15, namely, a portion for placing works W is disposed at the center, and a casing 30 is disposed surrounding the outer periphery of heating units 11 and 12 (further outside of a heat insulating structure 7).

The casing 30 is made of rust proof metals such as stainless steel or nickel steel in the shape of an inverted cup and the lower end thereof depends as far as a lower lid 3 of the pressure vessel and is hermetically joined therewith.

A gas introducing portion 32 having a large filter 31 is disposed to the upper end of the casing 30 and a check valve 33 for allowing gas to flow unidirectionally from the inside to the outside of the casing 30 is disposed.

In such a constitution, when a processing gas is supplied from the upper lid 2 of the pressure vessel 4 by way of the gas channel 23 into the processing chamber 8, the processing gas is introduced through the filter 31 into the inner vessel 16 with no substantial contact with the inner surface of the pressure vessel 4.

Further, since the processing gas is recovered and exhausted through the check valve 33, the filter 31 can be protected and powdery dusts are prevented from depositing on the inner surface of the filter 31 and powdery dusts collected on the outer surface of the filter 31 are prevented from scattering.

In this structure, since the inner diameter of the pressure vessel 4 can be effectively utilized to a full extent for the outer diameter of the casing 30, the filter 31 can be enlarged diametrically as much as possible, which enables to enlarge the portion of passage for the processing gas as much as possible, so that it can provide various advantages such as elimination of undesired effects on the processing performance of the pressure-processing apparatus 1 and saving of troubles for exchange and cleaning of the filter 31.

Figure 4:
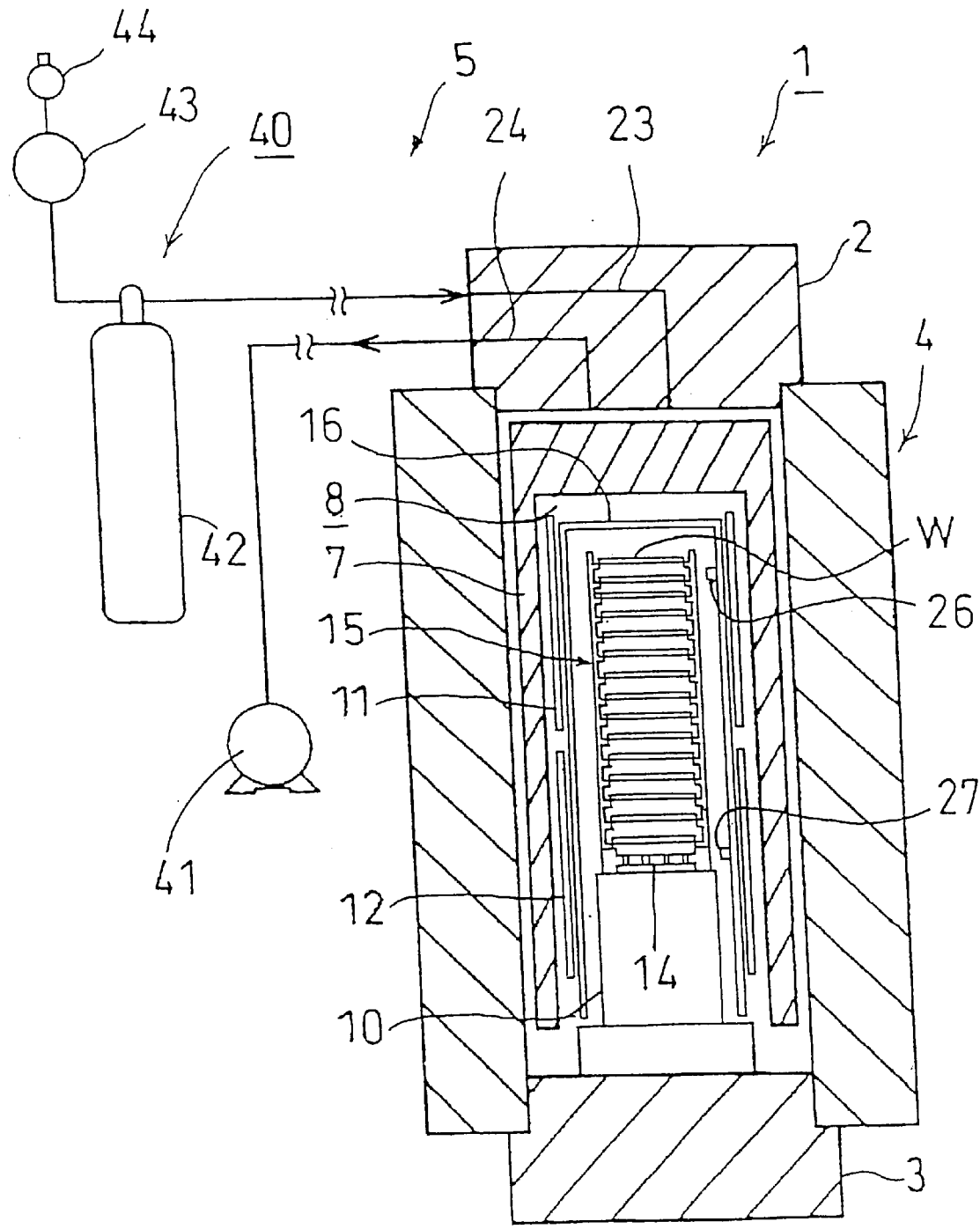
FIG. 4 is a cross sectional view showing a fourth embodiment of a pressure-processing apparatus according to the present invention.
Figure 5:
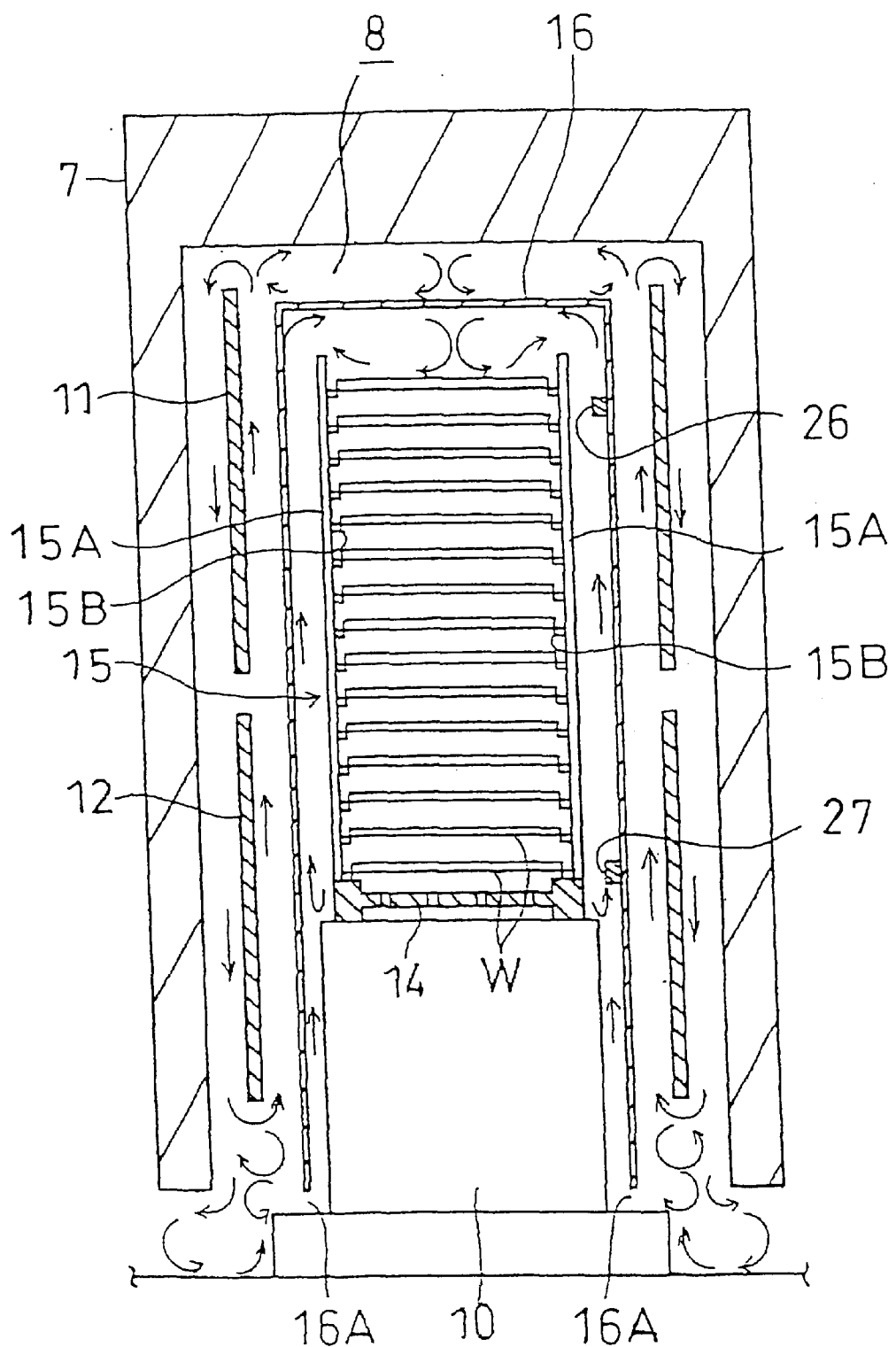
FIG. 5 is an enlarged cross sectional view of an inner structure of the pressure vessel shown in FIG. 4.
Figure 6:
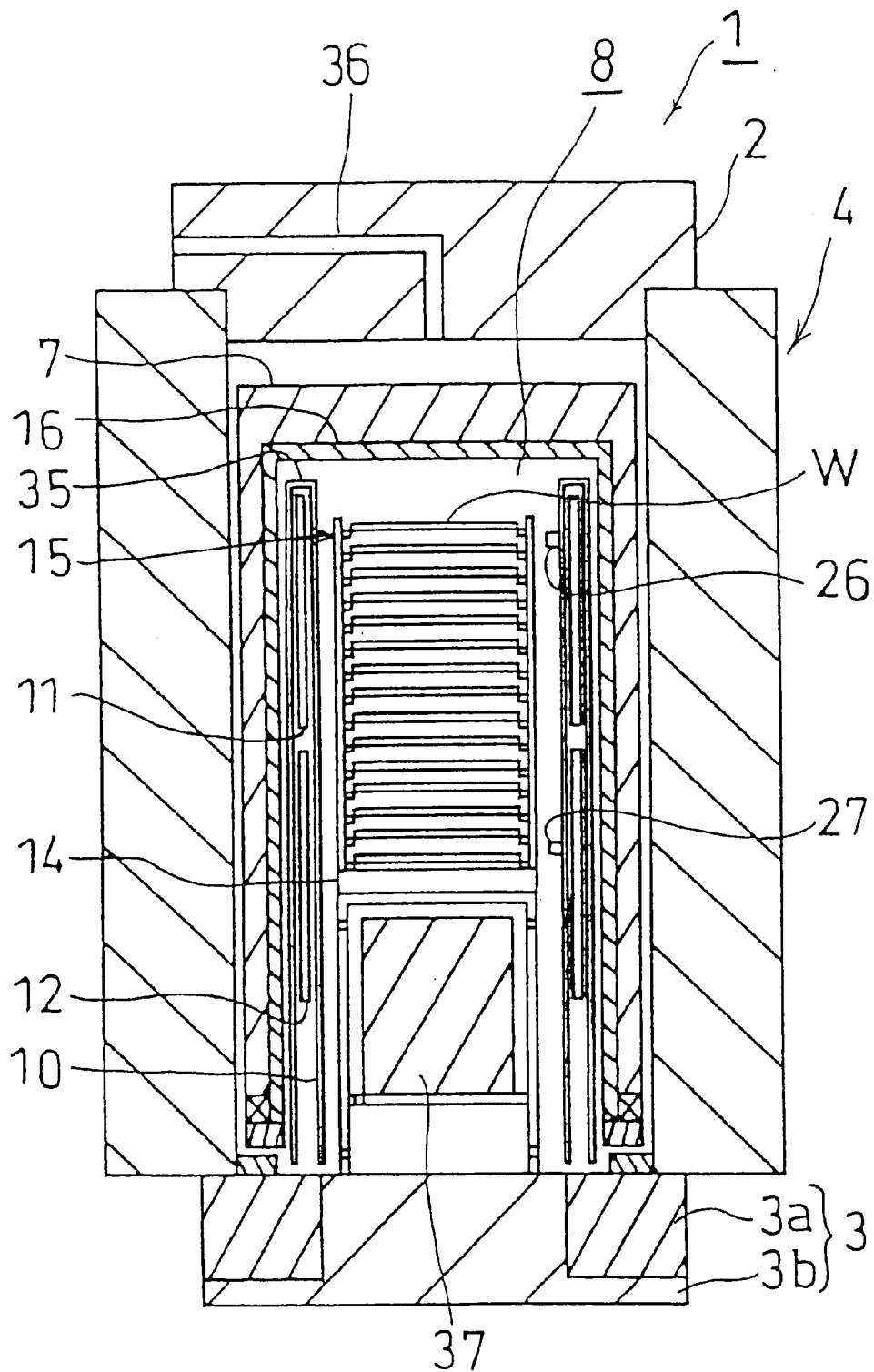
FIG. 6 is a cross sectional view showing a pressure vessel used in a fifth embodiment of a pressure-processing apparatus according to the present invention.
Figure 7:
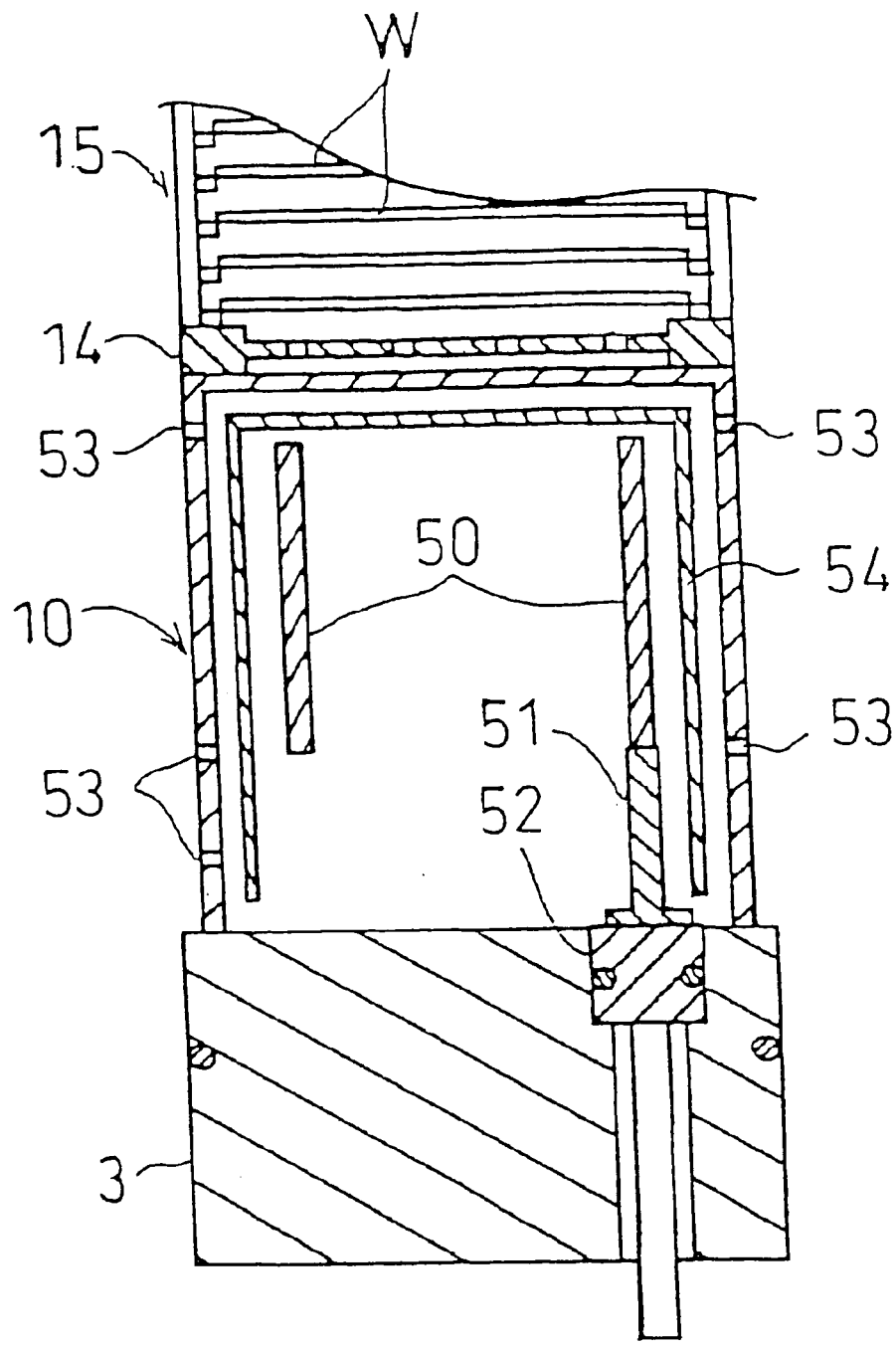
FIG. 7 is a cross sectional view showing a principal portion of a further embodiment provided with an auxiliary heater.

FIG. 4 and FIG. 5 show a fourth embodiment of a pressure-processing apparatus according to the present invention, FIG. 6 shows a pressure vessel used in a sixth embodiment of a pressure-processing apparatus according to the present invention, and FIG. 7 shows a principle portion for a pressure vessel using a sixth embodiment of a pressure-processing apparatus according to the present invention.

Since the fourth to sixth embodiments have basic constitutions in common with those of the pressure-processing apparatus described previously with reference to FIG. 1, those portions used in common carry same reference numerals.

Further, the present specification describes also for a pressure-processing method for semiconductors using the pressure-processing apparatus of the fourth embodiment shown in FIG. 4 and FIG. 5.

That is, a pressure-processing apparatus 1 for semiconductors in the fourth embodiments shown in FIG. 4 and FIG. 5 has a constitution in which a supporting device 15 capable of vertically supporting a plurality of works W is disposed in a processing chamber 8 in a pressure vessel 4 and heaters 11 and 12 are disposed so as to surround the supporting device 15.

Accordingly, a plurality of works can be loaded at once, for example, based on unit of lot into the processing chamber 8 of the pressure vessel 4, which can outstandingly improve the processing efficiency of the semiconductors.

Further, a casing (inner vessel) 16 made of a hermetically sealing material is disposed so as to surround the supporting device 15 between both of the supporting device 15 and the heaters 11 and 12 to the processing chamber 8 of the pressure vessel 4. Therefore, it is possible to suppress an inert gas (gas impurity components and the like) from directly reaching works W while being carried on a spontaneous convection based on the temperature difference or can prevent powdery dusts formed from the heat insulating structure 7 or heaters 11 and 12 from depositing on the works W.

In this case, since temperature sensors 26 and 27 for temperature control of the heaters 11 and 12 are disposed to the inside of the casing 16, the temperature in the processing chamber can be detected exactly to provide an advantage capable of easily controlling the inside of the processing chamber to a predetermined temperature.

This can obtain processed semiconductors at high and uniform quality.

On the other hand, the casing 16 may be disposed so as to surround the periphery of the supporting device 15 and the heaters 11 and 12. In this case, a heater casing 3a made of a hermetically sealing material for individually surrounding only the heaters are further disposed preferably in the casing (refer to FIG. 6). In this case, temperature sensors used for the temperature control of the heaters are may be preferably disposed between the heater casing and the supporting device.

In each of the cases described above, it is preferred that the heaters are divided vertically into a plurality of sections and the temperature sensor is also disposed in plurality correspondingly respectively to each of the heaters, which enables correct detection the temperature distribution in the vertical direction of the processing device and control for the uniform heating in the entire processing chamber.

A structure of disposing an auxiliary heater 50 in a base for placing the supporting device as shown in FIG. 7 is further preferred for unifying the heating in the processing chamber because a lower portion of the processing chamber difficult to be heated can also be heated efficiently. Further this also provides merit capable of rapidly unifying the heating. This constitution is suitable, for example, when the size of the pressure vessel is enlarged.

The pressure-processing method using the pressure-processing apparatus for semiconductors according to the present invention as described above comprises the following process. A plurality of works W stacked vertically are supported on a multi-stage supporting type supporting device 15, the entire supporting device 15 is confined being surrounded with a casing 16 made of a hermetically sealing material and they are contained and set in the processing chamber 8 of the pressure vessel 4.

Then, the inside of the casing (inner vessel) 16 is indirectly heated by the heaters 11 and 12 disposed in plurality at vertical positions of the processing chamber, the temperature at each of the portions is detected by temperature sensors 26 and 27 disposed at a plurality of vertical positions in the casing, and electric power supplied to each of the heaters is controlled such that each detected temperature is in accordance with a time/temperature program previously set along the axis of time to thereby keep the uniform heating in the vertical direction relative to the supporting device 15.

In the foregoings, "inside of the casing is heated indirectly by the heaters" means the state in which the heater and the supporting device (namely, works) are not placed in an identical space since the heaters themselves are surrounded by their own casing (heater casing) irrespective that the heaters are arranged on the outside of the casing or the inside of the casing.

Control for the electric power supplied to each of the heaters as described above may be executed according to the time/temperature program based on the detected temperature on every instance for the entire circle, but it is preferred to adopt a method of preparing a program patterning the obtained control hysteresis for the electric power charged to each of the heaters after conducting at least one cycle and executing the program along the axis of time in the subsequent cycles.

That is, in this method, the number of cycles of using the temperature sensor can be restricted and the detection error can be decreased by so much, and the duration time of the temperature sensor can also be extended.

When a gas is filled in the pressure vessel to increase the pressure, if the pressure on the suction side of the pressurizing compressing is made uniform during the cycle or on every cycle, the pressure in the processing chamber can be made constant, which is also useful for uniform quality of the processed semiconductors.

Explanations will be made more concretely with reference to FIG. 4 and FIG. 5.

The upper and lower heaters 11 and 12 adopt an ohmic wire heating system and they are wired respectively and allowed for independent temperature control.

The lower heater 12 is arranged for the height such that an upper portion about one-half of the vertical dimension thereof is exposed above the base 10. This is a countermeasure for avoiding uneven heating inevitably caused by a phenomenon that the lower heater 12 is disposed vertically and, accordingly, the temperature distribution in the lower half is remarkably lowered compared with that in the upper half.

The upper heater 11 is also arranged vertically but the phenomenon that the temperature becomes remarkably lower in the lower half than in the upper half does not appear distinctly because of the presence of the lower heater 12 in the upper portion. However, also in the upper heater, the temperature in the upper half tends to become somewhat higher in the upper half while somewhat lower in the upper end.

If it is intended to prevent also such a slight temperature distribution caused in the upper heater 11, it is effective to adopt a structure (not illustrated) of restricting the flow of an inert gas tending to turning back from the upper end to the rear side of the heater 11 with respect to the spontaneous convection of the ascending inert gas along the inner surface of each of the heater 11 and 12.

The number of dividing the heaters 11 and 12 may be increased such as three or four in a case where the pressure in the processing chamber 8 is not so high (including an atmospheric pressure state) since the spontaneous convection is not so vigorous.

On the base 10, a multi-stage support type supporting device 15 capable of vertically supporting a plurality of works W is disposed by way of a gettering material 14 and, accordingly, each of the heaters 11 and 12 surrounds the periphery of the supporting device 15.

In this fourth embodiment, since works W are wafers, the supporting device 15 has a structure as shown in FIG. 5 in which a plurality of pins 15B are disposed along a vertical direction from a pair of right and left support frames 15A opposing to each other for supporting works W between right and left pins 15B.

Then, an inner vessel 16 in the shape of an inverted cup is disposed between both of the supporting device 15 and the heaters 11 and 12 and the inner vessel 16 surrounds the supporting device 15.

The inner vessel 16 is made of a hermetically sealing material. Accordingly, this can suppress gas impurity components contained in an inert gas from being in direct contact with the works W supported on the supporting device 15, as well as can prevent powdery dusts formed from the heat insulating structure 7 or the heaters 11 and 12 from reaching the works W.

A gap 16A is disposed at the lower end of the inner vessel 16 so as to eliminate pressure difference between the inside and the outside of the inner vessel 16, to thereby protect the inner vessel 16. Accordingly, the inert gas is allowed to flow to some extent by way of the gap 16A to the inside of the inner vessel 16. Then, it is preferred to provide the filter 20 and the check valve shown in FIG. 1 to the gap 16A so as to interrupt communication of powdery dusts.

Further, at least the inner surface of the inner vessel 16 is preferably finished to be extremely smooth so as to attain a state of less adsorbing gas impurity components and so as to keep a state not deposited with oils and fats. Then, in a case where the inner vessel 16 is made of a metal or the like, it is necessary to apply cleaning to the inner surface, for example, by electrolytic polishing and/or supersonic cleaning.

At the inside of the inner container 16, temperature sensors 26 and 27 are disposed individually so as to correspond to positioning for the vertical heaters 11 and 12 respectively. Accordingly, when the temperature of the upper and lower vertical heaters 11 and 12 is controlled independently of each other, the standard temperature for them can be detected individually and exactly by the upper and lower sensors 26 and 27.

The temperature sensors 26 and 27 are preferably positioned at such height that the difference of the temperature distribution is most likely to appear. Then, with respect to works W supported by the supporting device 15, the upper temperature sensor 26 is positioned at a level corresponding to the work W at the uppermost stage, while the lower sensor 27 is positioned at a level corresponding to the work W at the lowermost stage.

As described above, since the temperature sensors 26 and 27 are disposed at the inside of the inner vessel 16, the temperature distribution in the inner vessel 16 can be detected directly to obtain an exact result of detection, which can properly control the upper and lower heaters 11 and 12 and, as a result, the heating can be unified in the entire region of the inner vessel 16.

On the contrary, if the temperature sensors 26 and 27 are disposed to the outside of the inner vessel 16 and temperature is controlled based on the detected temperature from them, the temperature distribution for heating can be unified for the inner vessel 16 itself. However, a spontaneous convection ascending at a low speed occurs in the inner vessel, which causes a phenomenon that the temperature is elevated only in the upper region in the inner vessel 16, so that this causes a difficulty for unifying the temperature distribution for heating in the inner vessel 16.

The pressure control unit 5 is constituted, as shown in FIG. 4, such that a gas charge/discharge device 40 is connected by way of a gas channel 23 and a vacuum pump 41 is connected by way of an inner channel 24 respectively, the channels 23 and 24 being disposed in the upper lid 2 of the pressure vessel 4.

In the gas charge/discharge device 40, when a reservoir 42 is used as a gas supply force as shown in the figure, and when the inside of the processing chamber is put to such a high pressure atmosphere as reaching several tens MPa, it is necessary to provide a compressor 43. In this case, a pressure regulation valve (regulator) 44 is preferably connected to the suction side of the compressor 43.

That is, the inner pressure of the reservoir 42 is lowered along with consumption of gases and the pressure increasing rate by the compressor 43 depends on the suction pressure thereof and the suction pressure fluctuates along with lowering of the reservoir inner pressure if the pressure regulation valve 44 is not disposed. This gives undesired effects on the inner pressure of the processing chamber 8 (pressure hysteresis relative to works W).

By the provision of the pressure regulation valve 44 as described above, since the suction pressure of the compressor 43 can be kept constant irrespective of the lowering of the inner pressure of the reservoir 42, the inner pressure of the processing chamber can be kept at a predetermined level during one cycle or on every cycle. Accordingly, also in a case of repeating cycles, the pressure hysteresis relative to the works W can be reproduced accurately for repeated cycles.

If it may be a worry that powdery dusts occur from the compressor 43 and the like in the gas charge/discharge device 40, it is preferred to dispose a filter (not illustrated) at a position in the gas passage as close as the pressure vessel 4 or in the gas channel 23 disposed in the upper lid 2 of the pressure vessel 4 so as to interrupt the communication of the powdery dusts.

For processing semiconductors by using the pressure-processing apparatus 1 of the fourth embodiment described above, the pressure vessel 4 is opened at first and the plurality of works W (for example, two lots of them) are supported on the supporting device 15. Then, the inner vessel 16 is capped over the supporting device 15 to assemble the pressure vessel 4 in a predetermined manner into the state shown in FIG. 4.

Then, in the pressure control unit 5, the vacuum pump 41 is operated at first to evacuate the inside of the processing chamber 8 of the pressure vessel 4, then the gas charge/discharge device 40 is actuated to fill an inert gas in the processing chamber 8 to increase the inner pressure to a predetermined level. Simultaneously, heating is started by the heaters 11 and 12 to elevate the temperature in the processing chamber 8 to a predetermined level.

After completing the temperature elevation/pressure increasing step as described above, the process enters a holding step. In the holding step, each of the temperatures detection by the upper and lower temperature sensors 26 and 27 is fed back so as to correspond to a predetermined time temperature program along the axis of time thereby controlling the electric power supplied to each of the heaters 11 and 12. This holds the uniform heating in the vertical direction relative to the supporting device 15, that is, to whole works W.

After competing the holding step as described above, the process enters a temperature lowering/pressure decreasing step to control the electric power supplied to each of the heaters 11 and 12 and recovery of the inert gas from the processing chamber 8 to the reservoir 42 by the gas charge/discharge device 40 of the pressure control unit 5.

Subsequently, the pressure vessel 4 is opened and the processed semiconductors are taken out of the supporting device 15 by which one cycle for the processing of semiconductors is completed.

It is known found that fluctuation is caused in the temperature distribution to such an extent as giving undesired effects on the characteristics of the obtained semiconductors in a case where the works W contain resin insulation materials sensitive to the temperature and the temperature of the works W is elevated to 200° C. or higher. Then, in such a case, it is preferred to control the electric power supplied to the heaters 11 and 12 by feeding back the temperature detected by the temperature sensor 26 and 27 not only in the holding step but also in the temperature elevation step or temperature lowering step.

By the way, when the temperature hysteresis in the processing chamber 8 through one cycle is patterned and programmed as a function of the axis of time, the temperature control for the heaters 11 and 12 can be simplified in the subsequent repeating cycles and, in addition, this can unify the condition in the processing chamber 8 (that is, for whole works W) to an identical temperature condition. Then, this leads to high and uniform quality of the semiconductors.

In view of the above, it is preferred to adopt a method of confirming that a satisfactory result can be obtained for the processed semiconductors after completing at least one cycle, preferably, about ten cycles, preparing a program patterned along the axis of time based on the control hysteresis of the electric power supplied to the heaters 11 and 12 in the past cycles, storing the program in a memory device and the like and executing the program in the subsequent cycles.

According to this method, since temperature detection by the temperature sensors 26 and 27 on every cycle can be saved in all of the subsequent cycles, the frequency of using the temperature sensors 26 and 27 can be saved and the detection error can be decreased by so much to improve the reliability. Further, since the frequency for using the temperature sensors 26 and 27 is decreased, it can provide a merit of extending the duration life time.

Particularly, in ordinary operation, since semiconductors of an identical shape are usually processed for several thousands of lots, repeating of the cycles based on the patterned program described above is extremely useful for the reduction of the processing cost and the like.

FIG. 6 shows a pressure vessel 4 used in the fifth embodiment of the pressure-processing apparatus 1 according to the present invention.

The pressure vessel 4 in the fifth embodiment is greatly different from the pressure vessel 4 in the fourth embodiment described above in that the inner vessel 16 is disposed so as to surround the periphery for both of the supporting device 15 and the heaters 11 and 12, that a heater casing 35 is disposed to the inside of the inner vessel 16 for surrounding only the heaters 11 and 12 individually and that temperature sensors 26 and 27 are disposed between the heater casing 35 and supporting device 15.

That is, in this fifth embodiment, the heater casing 35 is capped over the heaters 11 and 12 instead of disposing the heaters 11 and 12 in the inside of the inner vessel 16.

In addition, it is also different in that the lower lid 3 of the pressure vessel 4 has a structure of an inner and outer double lid 3a and 3b, one gas channel 36 used both for the charge/discharge of an inert gas and for evacuation is disposed in the upper lid 2 and that heat insulation material 37 is disposed to the inside of a base 10.

The heater casing 35 has an inner wall disposed to the inside of the heaters 11 and 12 and an outer wall disposed to the outside of the heaters 11 and 12, and the upper ends of each of the inner and outer walls are connected to constitute a so-called double walled structure with a U-shaped cross section.

Then, the lower end of the heater casing 35 is opened so as to eliminate the pressure difference between the inside and the outside of the wall in the heater casing 35 to protect the heater casing 35 and a gap is disposed relative to the lower lid 3 for also eliminating the pressure difference between the inside (on the side of the supporting device 15) and the outside (on the side of the inner vessel 16) of the heater casing 35 also to protect the heater casing 35.

Then, it is preferred to dispose a filter (not illustrated) to the lower open end of the heater casing 35 or the gap to interrupt the communication of powdery dusts.

Although not illustrated, the heater casing 35 may be of a structure of a hermetically including the heaters 11 and 12 by a so-called insert system. In this case, the heaters 11 and 12 are enclosed with an appropriate electric insulator and cast at the periphery thereof with a metal material such as aluminum.

In this constitution, the upper and lower heaters 11 and 12 are further partitioned independently in view of the structure, which is suitable to a case where the electric power supplied to each of the heaters 11 and 12 is different. For example, it is particularly suitable to a case decreasing the electric power supplied to the heaters 11 and 12 by increasing the heat insulation property of the heat insulating structure 7 to minimize the amount of heat dissipation where the temperature in the processing chamber is not elevated so high (about 500° C.).

FIG. 7 shows a principal portion of a pressure vessel 4 used in the sixth embodiment of a pressure-processing apparatus 1 according to the present invention.

In the pressure vessel 4 of the sixth embodiment, an auxiliary heater 50 is disposed to the inside of a base 10 on which a supporting device 15 is placed.

The auxiliary heater 50 is disposed in a case of requiring higher pressure in the processing chamber, for example, in a case where the large wafers W in excess of 300 mm diameter are processed. That is, since the load exerting on the upper lid 2 and the lower lid 3 increases in proportion with the square of the inner diameter of the vessel in the pressure vessel 4, the size and the weight of the pressure vessel 4 are increased more than required for containment performance for the works W and, accordingly, the works W can not be heated sufficiently only by the upper and lower heaters 11 and 12 disposed so as to surround the supporting device 15.

In this case, it may be considered to enlarge the size of the heaters 11 and 12 but enlargement of the heater 11 and 12 is not so advantageous in view of the heat generating efficiency thereof and this gives considerable effects also in view of the temperature distribution in the processing chamber 8, so that a method of providing the auxiliary heater 5 is suitable. In FIG. 7, 51 denotes a heater lead electrode rod and 52 denotes a plug.

In this case, since it is preferred to dispose a vent hole 53 for promoting the spontaneous convection in the base 10, it is preferred to dispose a heater casing 54 made of a hermetically sealing material so as to surround the auxiliary heater 50 in the base 10.

Since the main object of using the auxiliary heater 50 is to supplement the insufficient heat calorie of the heaters 11 and 12 as described above, it is not always necessary to control the temperature so as to be associated with the control for the electric power supplied to the heaters 11 and 12.

By the way, the present invention is not restricted only to each of the embodiments described above but various modifications are possible in accordance with the mode of practice regarding details, for example, of the structure.

For instance, the number of division for the heaters 11 and 12 is not always necessary to be identical with the number of the temperature sensors 26 and 27 to e installed.

EXAMPLE

Using the pressure-processing apparatus 1 of the fourth embodiment (FIG. 4 and FIG. 5), a process of filling a copper wiring film formed on an $SiO_2$ insulation film layer into contact holes was conducted by sputtering.

Silicon wafers were used as works W and they were supported by two lots, one lot having 25 sheets, on a supporting device 15 and they were set in a pressure vessel 4 as shown in FIG. 4.

A vacuum pump 41 of a pressure control unit 5 is actuated to evacuate the inside of the pressure vessel 4, then a gas charge/discharge device 40 is actuated and a replacing operation with an inert gas (argon gas in this case) was repeated twice relative to the inside of the pressure vessel 4.

Then, an inert gas was charged by the gas charge/discharge device 40 into the pressure vessel 4 at about 7 MPa and, at the same time, electric power is supplied to heaters 11 and 12 to conduct heating at a temperature elevation rate of 600° C./h.

Further, a compressor 43 is operated while setting a suction pressure of a pressure regulation valve 44 at 8 MPa to finally set the condition in the pressure vessel 4, that is, the processing chamber 8 at 400° C., 100 MPa. In this state, holding step was conducted for 5 min.

During the holding step, the temperatures detected by each of the temperature sensors 26 and 27 is fed back in accordance with the predetermined time/temperature program along the axis of time to control the electric power supplied to each of the heaters 11 and 12 and unify the heating in the entire region of the processing chamber 8.

Then, the electric power supplied to the heaters 11 and 12 was controlled while keeping the inner pressure in the processing chamber 8 as it was, to lower the temperature at a temperature lowering rate of 600° C./h till 150° C.

Then, the inert gas in the pressure vessel 4 was recovered to the reservoir 42 by the extent of 7 MPa by the gas charge/discharge device 40 and the remaining inert gas was released to atmosphere.

Subsequently, the pressure vessel 4 was opened and the silicon wafers after processing were taken out of the supporting device 15.

The foregoing procedures as one cycle were repeated for ten cycles in total.

In all of the cycles, the electric power supplied to the heaters 11 and 12 was controlled by adopting a method of feeding back the temperature detected by each of the temperature sensors 26 and 27 so as to correspond to the predetermined time/temperature program along the axis of time.

When the state of filled contact holes was observed for all of the thus obtained silicon wafers, it was confirmed that the copper wire film was filled into the contact holes each of 0.35 $\mu$m diameter and 1.2 $\mu$m depth over the entire wafer regions for all of the silicon wafers. Further, it was confirmed that there was neither denaturation nor contamination due to powdery dusts.

Preferred examples described in this specification are only illustrative but not limitative. The scope of the present invention is indicated by appended claims and the present invention includes all modification examples within the meanings of the claims.

What is claimed is:

1. A pressure-processing apparatus for semiconductors, comprising:

a pressure vessel capable of withstanding an internal pressure greater than an ambient pressure, a hermetically sealable inner vessel disposed in the pressure vessel, a processing chamber formed in the inner vessel and having a portion for placing works, a gas introducing portion disposed in the inner vessel and connected for receiving a gas introduced from the pressure vessel, and a filter for collecting powdery dusts, said filter being disposed in the gas introducing portion for filtering dust from within the pressure vessel.

2. A pressure-processing apparatus for semiconductors, comprising:

(1) a pressure vessel capable of withstanding an internal pressure greater than an ambient pressure, (2) a processing chamber formed in the pressure vessel and having a portion for placing works and a charge/discharge portion for a processing gas, (3) heating units surrounding the portion for placing the works in the process chamber;

(4) a hermetically scalable inner vessel disposed between the inside of the heating units and the portion for placing the works, (5) a gas introducing portion disposed in a lower portion of the inner vessel and connected for receiving a gas introduced from the pressure vessel, and (6) a filter for collecting powdery dusts, said filter being disposed in the gas introducing portion for filtering dust from within the pressure vessel.

3. A pressure-processing apparatus as defined in claim 2, wherein the inner vessel has a check valve positioned for allowing a gas to flow unidirectionally from the inside to the outside thereof.

4. A pressure-processing apparatus as defined in claim 2, wherein a casing made of a rust proof metal is disposed in the pressure vessel so as to surround the heating unit, and the casing is provided with another gas introducing portion having a powdery dusts collecting filter.

5. A pressure-processing apparatus as defined in claim 4, wherein the casing has a check valve positioned for allowing a gas to flow unidirectionally from the inside to the outside thereof.

6. A pressure-processing apparatus as defined in claim 2, wherein a temperature sensor is attached to the inside of the inner vessel.

7. A pressure-processing apparatus as defined in claim 2, wherein the portion for placing the works can locate a plurality of works vertically.

8. A pressure-processing apparatus as defined in claim 7, wherein the heating units are divided vertically and the temperature sensors are disposed corresponding to the divided heating units, respectively.

9. A pressure-processing apparatus as defined in claim 7, wherein an auxiliary heating unit is disposed in a base for mounting the portion for placing the works.

10. A pressure-processing apparatus as defined in claim 2, wherein the pressure vessel is capable of withstanding an internal pressure of about 200 kgf/cm$^2$.

* * * * *